United States Patent [19]
Hariton

[11] Patent Number: 5,926,064
[45] Date of Patent: Jul. 20, 1999

[54] FLOATING MOS CAPACITOR

[75] Inventor: Dan I. Hariton, Pinole, Calif.

[73] Assignee: National Semiconductor Corporation, Santa Clara, Calif.

[21] Appl. No.: 09/012,773

[22] Filed: Jan. 23, 1998

[51] Int. Cl.$^6$ .................................................. H01L 25/00
[52] U.S. Cl. .......................... 327/581; 327/566; 257/312; 257/296
[58] Field of Search ..................................... 327/530, 566, 327/581, 536, 390; 257/296, 306, 312

[56]  References Cited

U.S. PATENT DOCUMENTS

| | | | |
|---|---|---|---|
| 3,798,508 | 3/1974 | Kohashi | 317/234 R |
| 4,453,090 | 6/1984 | Sempel | 307/303 |
| 4,786,828 | 11/1988 | Hoffman | 307/303 |
| 5,557,235 | 9/1996 | Koike | 327/564 |

*Primary Examiner*—Tim Callahan
*Assistant Examiner*—Jung Ho Kim
*Attorney, Agent, or Firm*—Skjerven, Morrill, MacPherson, Franklin & Friel LLP; Edward C. Kwok

[57]  ABSTRACT

A structure is provided to create a voltage-independent capacitive structure using a typical MOS fabrication process. The capacitive structure includes two FET devices connected in series by having their source, drain, and body terminals all coupled together into a common node. A biasing circuit that includes a current generator and a current mirror biases the common node so that a constant capacitance is maintained across the gate terminals of the two serially connected FET devices, independent of the applied voltage.

10 Claims, 3 Drawing Sheets

5,926,064

FLOATING MOS CAPACITOR

BACKGROUND OF THE INVENTION

1. Field of the Invention

The present invention relates to integrated circuit (IC) devices, and in particular, to floating capacitive structures on an IC chip.

2. Discussion of the Related Art

In a mixed-mode, analog-and-digital integrated circuit (IC), a voltage-independent, or "floating" capacitor is a commonly required component. Such a capacitor must maintain a constant capacitance over a range of terminal voltage signals. A floating capacitor can be created in a number of ways. For example, a floating capacitor can be formed by providing a dielectric layer between two polysilicon layers or two thin film metal layers. Alternatively, a capacitive structure could be manufactured by providing a conductive layer beneath the gate oxide of a typical CMOS device. However, all these structures require steps additional to a conventional CMOS process. Any such additional steps beyond the basic CMOS manufacturing sequence add time, complexity, and cost to the final chip.

In U.S. Pat. No. 4,786,828, issued Nov. 22, 1988 to Hoffman, a floating capacitor is described which can be manufactured using conventional CMOS process steps. As shown in FIG. 1, FET devices 102 and 103 are connected in series at their gate terminals. The source, drain and body terminals of each device are combined to create a single signal terminal on each device. A biasing network, made up of series-connected FET devices 106, 107, 108, and biasing FET device 105, is applied to the gate terminals of FET devices 102 and 103. Device 105 provides the necessary output voltage to keep devices 102 and 103 operating in their saturation regions. While the invention of Hoffman can be implemented with conventional CMOS process, capacitive performance problems can develop.

Due to the physics of semiconductor devices, a small parasitic capacitance exists at the substrate junction in CMOS structures. Because Hoffman commonly connects source, drain, and body terminals of each of FET devices 102 and 103, and uses these common connected terminals as the signal terminals of capacitive circuit 101, parasitic capacitances C204 and C205 are created as shown in FIG. 2. As can be seen in FIG. 2, in addition to MOS capacitances C202 and C203, capacitance C204 exists at one signal terminal of capacitive circuit 101, while capacitance C205 exists at the other. If capacitive circuit 101 is used as a bypass capacitor with one end coupled to ground potential, the relatively small parasitic capacitances C204 and C205 are not significant. Capacitance C204 will simply add to the total bypass capacitance while capacitance C205 will be shorted out. However, in other circuit applications, significant signal loss can occur due to the capacitive path to ground provided by both parasitic capacitors C204 and C205.

Accordingly, it is desirable to provide a floating capacitive structure that can be manufactured using a conventional CMOS process and which minimizes performance problems due to parasitic capacitance.

SUMMARY OF THE INVENTION

The present invention provides a structure for a floating MOS capacitor that can be manufactured with a conventional CMOS process, with minimized parasitic capacitance. According to the present invention, a capacitive structure includes two serially connected FET devices and a biasing circuit. The source, drain, and body terminals of both FET devices are all commonly connected, forming a single bias input terminal. The remaining gate terminals provide the input and output terminals for the capacitive structure. The biasing circuit is connected to the bias input terminal, and biases the two FET devices so that they operate in the saturation region for a range of desired input voltages to the capacitive structure.

In an embodiment of the invention, the biasing circuit includes a current generator and a current mirror. A predefined reference current is mirrored and reduced by the current mirror so that an output transistor in the current mirror is biased into its linear region. This in turn provides a high-impedance output for biasing the two FET devices into their saturation regimes.

In another embodiment of the invention, the biasing circuit pulls the bias input terminal to ground. This ensures constant capacitance as long as the gate voltage at each FET device is greater than the threshold voltage that FET device.

In yet another embodiment of the invention, the biasing circuit pulls the bias input terminal to the power supply voltage of the circuit. This ensures constant capacitance as long as the gate voltage at each FET device is less than the power supply voltage of the circuit by at least the threshold voltage for that FET device.

This invention will be more fully understood after consideration of the following detailed description taken along with the accompanying drawings.

BRIEF DESCRIPTION OF THE DRAWINGS

Use of the same reference numbers in different figures indicates similar or like elements.

DETAILED DESCRIPTION

Figure 1:
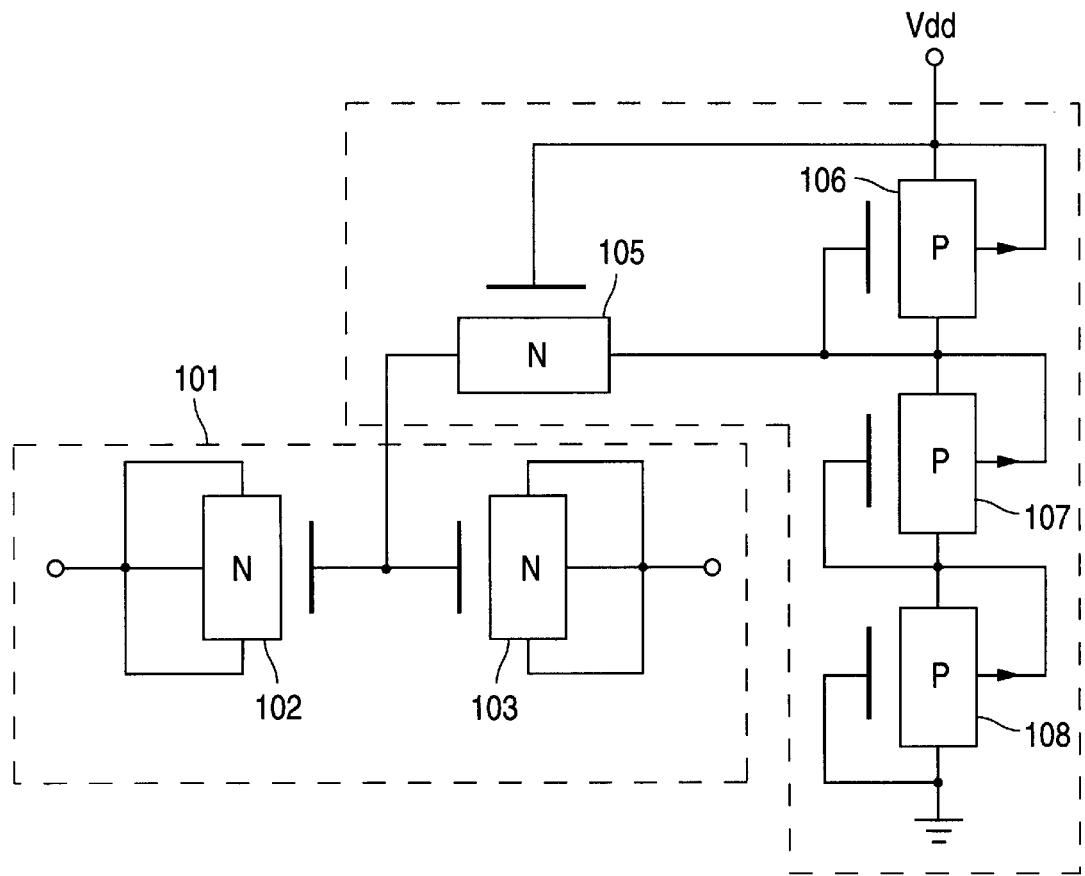
FIG. 1 is a schematic diagram of the invention of Hoffman.
Figure 2:
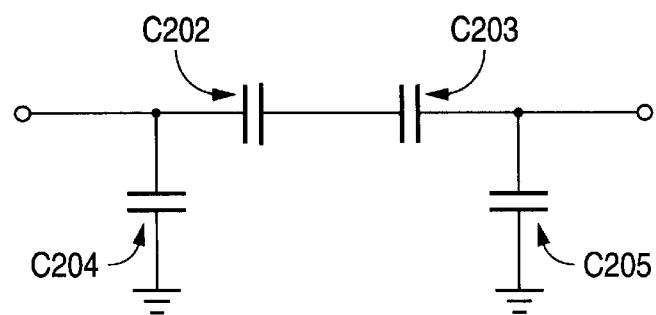
FIG. 2 is a schematic diagram of the capacitive circuit of Hoffman, including parasitic capacitances.
Figure 3:
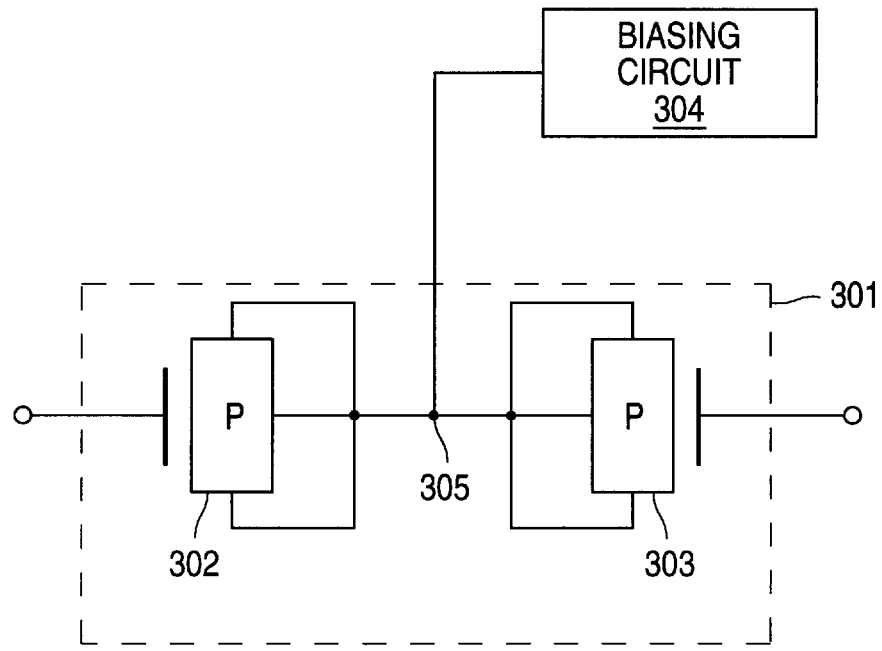
FIG. 3 is a schematic diagram of an embodiment of the present invention.
Figure 4:
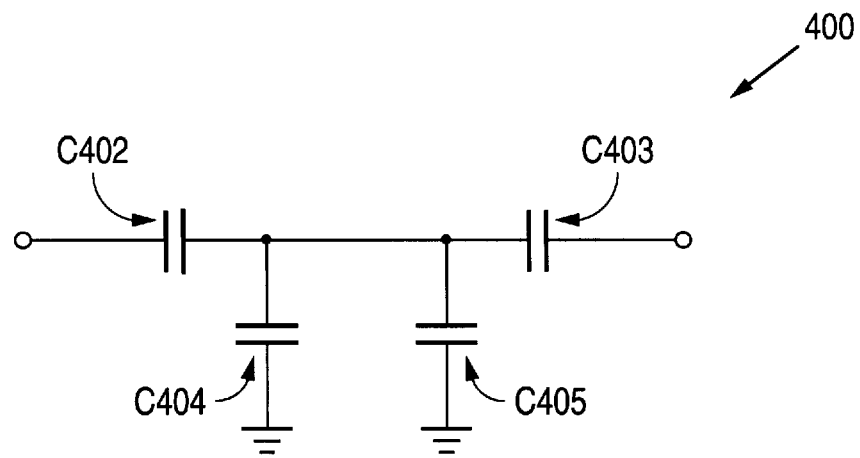
FIG. 4 is a schematic diagram of the capacitive circuit of the present invention, including parasitic capacitances.

FIG. 3 shows a floating capacitive structure fabricated by a conventional MOS fabrication process, as taught by the present invention. A capacitive circuit 301 includes PMOS devices 302 and 303, fabricated on a p-type substrate. The source, drain, and body terminals of devices 302 and 303 are all connected together to form a bias terminal 305. A biasing circuit 304 is connected to bias terminal 305. The gate terminals of devices 302 and 303 provide the input and output terminals of the capacitive structure. While devices 302 and 303 are shown as PMOS devices, it will be apparent to those skilled in the art that NMOS devices fabricated on an n-type substrate could also be used in the present invention. It should also be noted that PMOS devices on an n-type substrate and NMOS devices on a p-type substrate could also be utilized. However, in those cases the body terminal would be the substrate itself—no n-well or p-well, respectively— making such implementations more susceptible to noise from adjacent circuitry. Capacitive circuit 301 can be modeled by schematic circuit 400 of FIG. 4. Capacitances C402 and C403 are the MOS capacitances of FET devices 302 and 303, respectively. Capacitances C404 and C405 are the parasitic capacitances of FET devices 302 and 303, respectively. In this embodiment of the present invention, parasitic capacitances C404 and C405 are located away from capacitive circuit 301's input and output terminals, minimizing any effects on the input and output signals. Therefore, the effective capacitance, Ceff, of capacitive circuit 301 is given by the following:

$$Ceff=C402*C403/(C402+C403)$$

If C402 has the same value as C403, then:

$$Ceff=C402/2=C403/2$$

Figure 5:
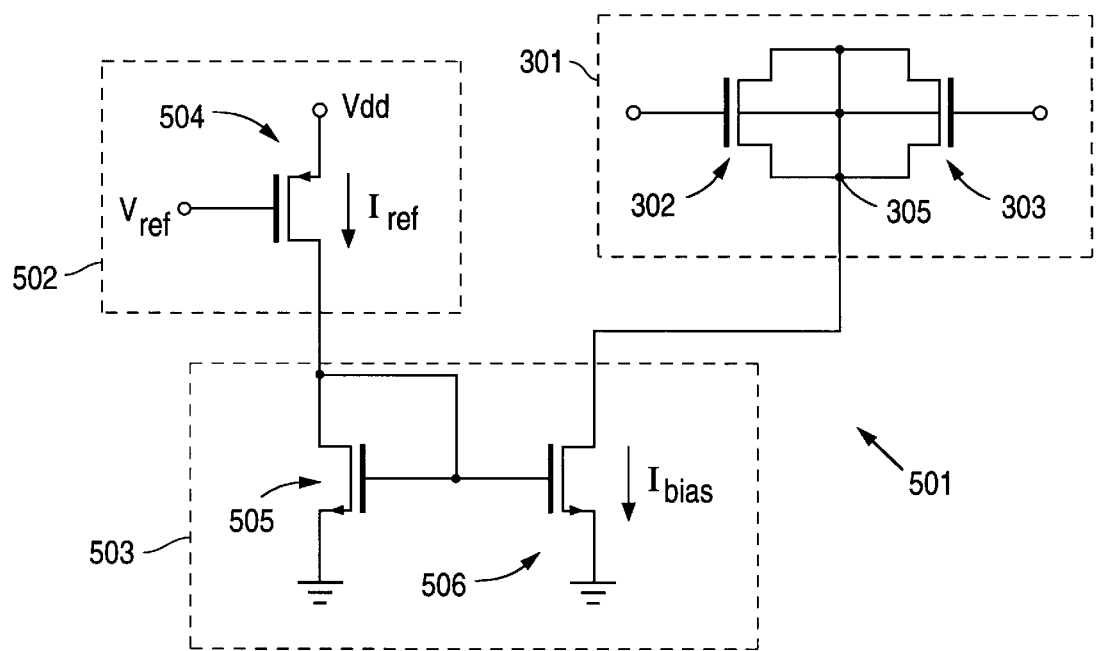
FIG. 5 is a schematic diagram of an embodiment of the present invention, with low biasing.

FIG. 5 shows an embodiment of biasing circuit 304 integrated with capacitive circuit 301. A current generator 502 includes a PMOS device 504. The circuit power supply voltage Vdd is applied to the drain terminal of device 504. A predetermined voltage Vref is input to the gate of device 504, which sources a reference current Iref. NMOS device 505 in current mirror 503 accepts current Iref, which is mirrored by scaled NMOS device 506 as a bias current Ibias. By adjusting the channel length of device 506 relative to that of device 505, the ratio of Ibias to Iref is set. This ratio is defined such that Ibias is several orders of magnitude smaller than Iref, in order to make device 506 operate at very low current. As Ibias approaches zero, device 506 behaves like a large resistor. Quiescent current flow through current generator 502 and current mirror 503 is minimized through adjustment of reference voltage Vref to produce a small Iref. The drain terminal of device 506 connected to bias terminal 305. Because device 506 is operating within its linear regime, it acts as a high-impedance resistor to ground, biasing bias terminal 305 to ground, even when Ibias equals zero. At this point, capacitive circuit 301 provides constant capacitance as long as both devices 302 and 303 are operating in their respective saturation regimes. Therefore, device 302 and device 303 must each satisfy the relationship:

$$|Vg-Vsdb| \geq Vt$$

where Vsdb is the bias voltage applied to bias terminal 305, and Vt and Vg are the threshold voltage and the gate terminal voltage, respectively, of either device 302 or device 303. Vsdb, which is determined by current generator 502 and current mirror 503, is at ground, so capacitive structure 301 provides constant capacitance as long as the gate terminal voltages of devices 302 and 303 are both in the range between their respective threshold voltages and the power supply voltage of the circuit, Vdd.

Figure 6:
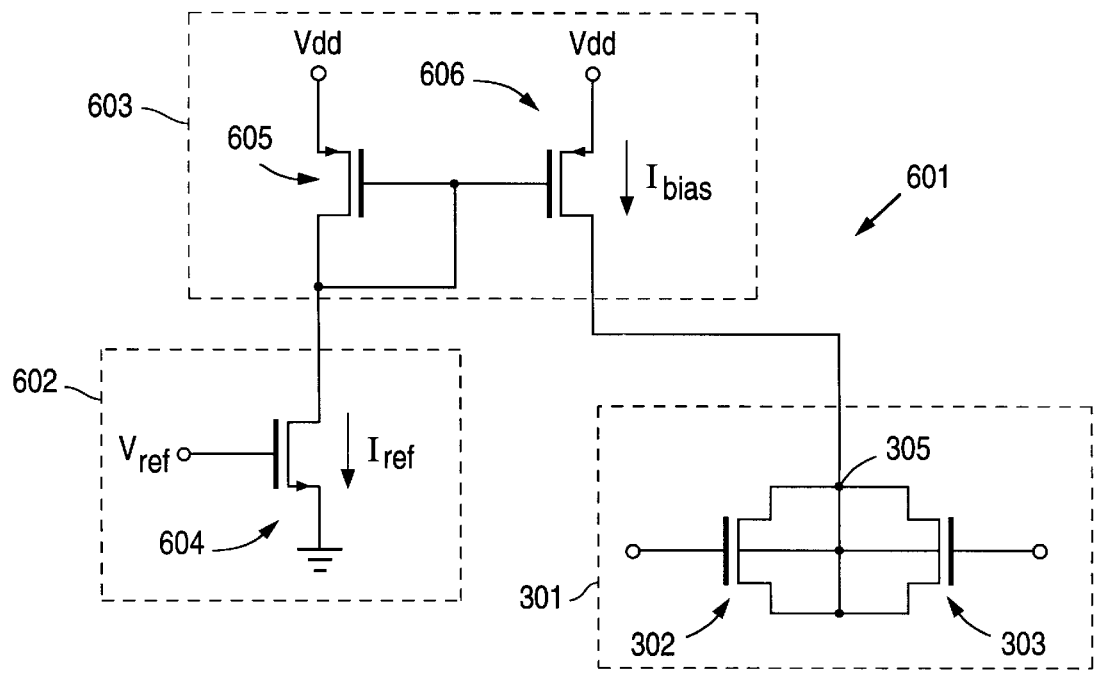
FIG. 6 is a schematic diagram of an embodiment of the present invention, with high biasing.

FIG. 6 is another embodiment of biasing circuit 304, integrated with capacitive circuit 301. A current generator 602 includes an NMOS device 604. A predetermined voltage Vref is input to the gate of device 604, which sinks a reference current Iref from the source terminal of PMOS device 605 in current mirror 603. This reference current Iref is then mirrored by matched PMOS device 606 as a bias current Ibias. By adjusting the channel length of device 606 relative to that of device 605, the ratio of Ibias to Iref is set. This ratio is defined such that Ibias is several orders of magnitude smaller than Iref, in order to make device 606 operate at very low current. As Ibias approaches zero, device 606 behaves like a large resistor. Quiescent current flow through current generator 602 and current mirror 603 is minimized through adjustment of reference voltage Vref to produce a small Iref. The drain terminal of device 606 is connected to bias terminal 305. Because device 606 is operating within its linear regime, it acts as a high-impedance resistor to Vdd, biasing bias terminal 305 high, even when Ibias equals zero. At this point, capacitive circuit 301 provides constant capacitance as long as both devices 302 and 303 are operating in their respective saturation regimes. Therefore, devices 302 and 303 must each satisfy the relationship:

$$|Vg-Vsdb| \geq Vt$$

where Vsdb is the bias voltage applied to bias terminal 305, and Vt and Vg are the threshold voltage and the gate terminal voltage, respectively, of either device 302 or device 303. Vsdb is determined by current generator 602 and current mirror 603, and is at Vdd. Therefore, capacitive structure 301 provides constant capacitance while the gate terminal voltages of devices 302 and 303 fall within the following range:

$$ground \leq Vg30x \leq (Vdd-Vt30x)$$

where Vg30x and Vt30x refer respectively to the gate voltage and threshold voltage of each device.

The above-described embodiments of the present invention are merely meant to be illustrative of the present invention and not intended to be limiting. It will thus be apparent to those skilled in the art, upon consideration of the above detailed description and drawings, that various changes and modifications may be made within the scope of the present invention. For example, NMOS devices could be incorporated into the embodiments of the present invention where PMOS devices were described, and vice versa. Also, the bias circuit could be implemented an any manner that provides a high-impedance output or a low current leakage path, such as a transistor network. Finally, any circuit for a current source, such as a cascode current source, and for a current mirror, such as a Wilson current mirror, could be used instead of the previously described circuits. Therefore, the appended claims encompass all such changes and modifications as fall within the scope of this invention.

I claim:

1. In an integrated circuit, a capacitive structure comprising:

a first FET device;

a second FET device, wherein the source terminals, drain terminals, and body terminals of said first FET device and said second FET device are all connected together to form a single bias input terminal; and a biasing circuit which supplies a bias signal at said bias input terminal such that said first FET device and said second FET device each operate in their saturation regime over a range of desired voltages at their respective gate terminals.

2. The structure of claim 1, wherein said first and second FET devices comprise p-channel FET devices.

3. The structure of claim 2, wherein said first and second FET devices are fabricated on a p-type substrate.

4. The structure of claim 3, wherein said biasing circuit comprises:
   a current source to produce a reference current based on a reference voltage input; and
   a current mirror comprising an output transistor carrying a current proportional to said reference current, and operating in the linear regime.

5. The structure of claim 4, wherein:
   said current mirror comprises a plurality of n-channel FET devices.

6. The structure of claim 5, wherein said current source comprises a p-channel FET device, wherein the source terminal of said p-channel FET device is connected to said current mirror.

7. The structure of claim 4, wherein:
   said current mirror comprises a plurality of p-channel FET devices.

8. The structure of claim 7, wherein said current source comprises an n-channel FET device, wherein the drain terminal of said n-channel FET device is connected to said current mirror.

9. The structure of claim 1, wherein said first and second FET devices comprise n-channel FET devices.

10. The structure of claim 9, wherein said first and second FET devices are fabricated on an n-type substrate.

* * * * *